United States Patent [19]
Shirasaki et al.

[11] Patent Number: 5,378,859
[45] Date of Patent: Jan. 3, 1995

[54] FILM WIRING BOARD

[75] Inventors: Tomoyuki Shirasaki, Hachioji; Osamu Kuwabara, Tokyo, both of Japan

[73] Assignee: Casio Computer Co., Ltd., Tokyo, Japan

[21] Appl. No.: 23,213

[22] Filed: Feb. 25, 1993

[30] Foreign Application Priority Data

Mar. 2, 1992 [JP] Japan .................................. 4-080469

[51] Int. Cl.$^6$ ............................................. H05K 1/02
[52] U.S. Cl. ................................. 174/261; 174/260; 361/760; 361/762; 361/767; 361/768
[58] Field of Search ............... 174/250, 259, 260, 261, 174/268; 361/400, 403, 409, 411, 760, 762, 750, 767, 768, 771, 774, 777, 779, 808, 812

[56] References Cited

U.S. PATENT DOCUMENTS

| | | | |
|---|---|---|---|
| 4,339,785 | 7/1982 | Ohsawa | 361/400 X |
| 4,509,096 | 4/1985 | Baldwin et al. | 361/403 X |
| 4,806,706 | 2/1989 | Machida et al. | 174/250 |
| 4,860,442 | 8/1989 | Ainsworth et al. | 174/250 X |
| 4,882,656 | 11/1989 | Menzies, Jr. et al. | 361/400 X |
| 4,972,050 | 11/1990 | Hammond et al. | 174/261 X |

Primary Examiner—Leo P. Picard
Assistant Examiner—L. Thomas
Attorney, Agent, or Firm—Frishauf, Holtz, Goodman & Woodward

[57] ABSTRACT

This application discloses a film wiring board for directly mounting an electronic parts such as an IC chip, on which a protective film having an opening can be formed in one step by a screen printing. This film wiring board has wiring patterns including connection pads and lead wires. Connection electrodes of the IC chip are connected to the connection pads via soldering bumps. Since the width of each of the lead wires is comparatively small at 10 μm–30 μm, the once molten solder when the connection is done is kept on the corresponding connection pad by the surface tension and is prevented from flowing from the connection pad to the corresponding lead wire. Therefore, since the opening of the protective film need not have a function for stopping the flow of the solder, there may be no problem if the opening is comparatively enlarged. Consequently, the protective film having the opening can be formed in one step by the screen printing, and then a productivity of the film wiring board may be increased and its production cost can be reduced.

18 Claims, 7 Drawing Sheets

FILM WIRING BOARD

BACKGROUND OF THE INVENTION

1. Field of the Invention

This invention relates to a film wiring board.

2. Description of the Related Art

A film wiring board on which electronic parts such as IC chips are directly mounted has such a structure, for example, as shown in FIGS. 5(A) and 5(B). Regarding this film wiring board 1, wiring patterns 4 of metal such as copper are formed via a bonding agent 3 on an upper surface of a film base 2 made of resin, as explained below. Connection pads 4a in almost circular shape and lead wires 4b which are lead out from the connection pads 4a are formed at predetermined portions of the wiring patterns 4. Protective film 5 of resin such as epoxy is provided entirely on exposed upper surfaces of the bonding agent 3 and the wiring pattern 4 excepts for central portions of upper surfaces of the connection pads 4a. Thus, almost circular openings 6 are formed in the protective film 5 at the central portions of the upper surfaces of the connection pads 4a. As will be explained below, when connection electrodes of an IC chip are connected via soldering bumps to the connection pads 4a exposed through the openings 6, the IC chip is mounted on the film wiring board 1.

Next, manufacture of the conventional film wiring board 1 will be described with reference to FIGS. 6(A)-6(C). First, as shown in FIG. 6(A), a metal foil 8 for forming the wiring patterns 4 (see FIG. 5(A)) is bonded on the upper surface of the film base 2 via the bonding agent 3. Then, an upper surface of the metal foil 8 is coated with a photoresist 9 having a predetermined pattern corresponding to the wiring patterns 4, in a well-known method of photolithography. When the metal foil 8, with the photoresist 9 being used as an etching mask, is etched by means of wet etching using copper chloride solution or ferric chloride solution, the wiring patterns 4 having the connection pads 4a and the lead wires 4b are formed as shown in FIG. 6(B) and FIG. 5(A). Thereafter, the photoresist 9 is stripped. As shown in FIG. 6(C), the protective film 5 is formed by coating an epoxy resin or the like on the exposed entire upper surface of the bonding agent 3 and the wiring patterns 4 in a method such as spin coat or roll coat and drying the coated resin, and the photoresist 10 of a predetermined pattern having openings 10a corresponding to the openings 6 (see FIG. 5(B)) is coated on an upper surface of the protective film 5. When the protective film 5 is etched by a well-known method, with the photoresist 10 being used as an etching mask, the almost circular openings 6 are formed in the protective film 5 at the central portions of the upper surface of the connection pads 4a, as shown in FIGS. 5(A) and 5(B). After that, the photoresist 10 is stripped. Thus, the film wiring board 1 is produced.

Mounting of an IC chip on the film wiring board 1 by a flip-chip method will be described with reference to FIGS. 7(A)-7(C). First, as shown in FIG. 7(A), at a portion of the upper surface of the film wiring board 1 where an IC chip is to be mounted, a flax 11 is painted by a letterpress printing. This flax 11 is used to fix temporarily the IC chip. Then, as shown in FIG. 7(B), soldering bumps 13 provided in advance at connection electrodes 12 of the IC chip 7 are positioned on the connection pads 4a at the openings 6 (see FIG. 5(A)), and are temporarily fixed by the flax 11. Then, the connection electrodes 12 are pressed on the connection pads 4a while the electrodes 12 are heated by means of, for example, a thermal press head (not shown), the bumps 13 are melted, bonded to the connection pads 4a, and solidified, and then, the connection electrodes 12 of the IC chip 7 are connected to the connection pads 4a via the soldering bumps 13. Thereafter, the flax 11 is removed by a well-known method such as cleaning with of a solvent, and the resultant structure is sealed with a sealing compound 14 of resin such as epoxy, as show in FIG. 7(C). Thus, the IC chip 7 is mounted on the film wiring board 1.

In the conventional film wiring board 1 as described above, since the openings 6 are formed by a photolithography method in the protective film 5 coated on the entire surface of the film base 2 including the wiring patterns 4, the conventional board 1 requires more steps such as the protective film coating, photoresist coating, light exposing, development, etching, photoresist stripping, etc., as compared with a case where, for example, the protective film 5 having the openings 6 is formed in one step by a screen printing.

Explained here is a reason why the openings 6 are formed by the photolithography method in the protective film 5 coated on the entire surface of the film base 2 including the wiring patterns 4. Since the metal foil 8 bonded via the bonding agent 3 on the upper surface of the film base 2 is wet-etched with the photoresist 9 being used as an etching mask so that the wiring patterns 4 having the connection pads 4a and the lead wires 4b are formed, it takes much time to etch a bottom portion of the metal foil 8, contacting with the bonding agent 3, in the wet-etching process. Therefore, if the width of the photoresist 9 is decreased, all the upper portions of the metal foil 8 will be etched while the bottom of the metal foil 8 will be etched, and it will be impossible to make the width of the photoresist 9 i.e., the width of the lead wire 4b of the wiring patterns 4 smaller than 50 $\mu$m. The width of the lead wire 4b in the conventional film wiring board 1 is limited in the range of at most 50 $\mu$m-60 $\mu$m. In this case, if a diameter of each of the connection pads 4a is determined at 100 $\mu$m-140 $\mu$m and the connection electrodes 12 of the IC chip 7 are connected via the soldering bumps 13 to these connection pads 4a, there is a possibility that the soldering bump 13 once melted at the time of thermal press flows from the corresponding connection pad 4a to the corresponding lead wire 4b, further from the lead wire 4b to its adjacent lead wire 4b, and thus, short-circuit may occur between adjacent lead wires 4b, because the width of the lead wire 4b is comparatively large, i.e. at 50 $\mu$m-60 $\mu$m.

In order to prevent the flow of the solder from the connection pad 4a to the lead wire 4b, the diameter of the opening 6 of the protective film 5 is made to be slightly smaller than that of the connection pad 4a, for example, at 60 $\mu$m-100 $\mu$m, so that the inner wall of the opening 6 prevents the molten solder from flowing out. However, if the diameter of the opening 6 of the protective film 5 is small or fine, i.e. at almost 60 $\mu$m-100 $\mu$m, the protective film 5 having the openings 6 cannot be formed by the screen printing and it must be formed by the photolithography method. As a reason for this, the diameter dimension of the smallest opening in the screen is at almost 200 $\mu$m and its positional accuracy is smaller than ±300 $\mu$m while in the case of the photolithography method, the diameter dimension of the smallest opening is at almost 10 μm and its positional accuracy is smaller than ±20 μm.

As understood from the above, the conventional film wiring board 1 in which the openings 6 are formed by the photolithography method in the protective film 5 coated on the entire surface of the film base 2 including the wiring patterns 4 requires more production steps, decreases its productivity, and needs much manufacturing cost, in comparison with a case in which the protective film having the openings 6 is formed in one step by the screen printing.

SUMMARY OF THE INVENTION

This invention is contrived from the above circumstances, and its object is to provide a film wiring board in which a protective film having at least one opening can be formed in one step by the screen printing.

In order to achieve the above described object, a film wiring board of this invention comprises a film base having a plurality of wiring patterns on its upper surface, each of the wiring patterns having a connection pad and a lead wire which is extended from the connection pad and has a width of 10 μm–30 μm, and a protective film formed on the upper surface of the film base so as to hold the wiring patterns therebetween, and having an opening which allows the connection pads of the plurality of the wiring patterns to be exposed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1A:
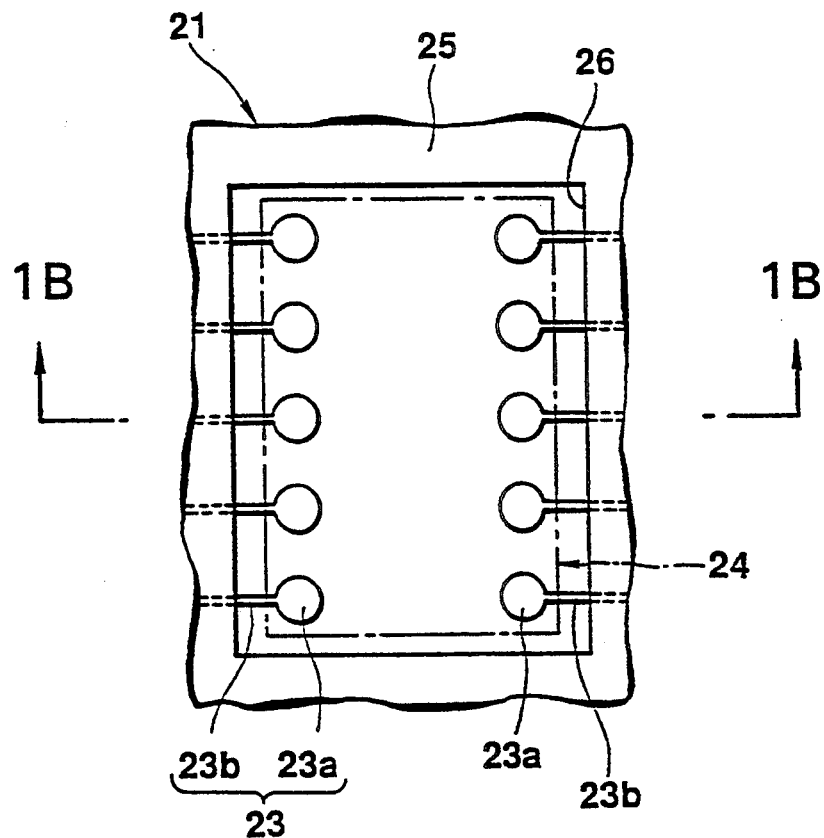
FIG. 1(A) is a plan view showing a main portion of a film wiring board according to an embodiment of this invention.
Figure 1B:
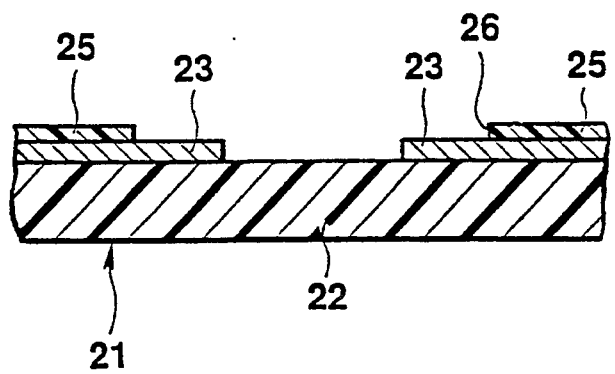
FIG. 1(B) is a cross-sectional view taken along line 1B—1B in FIG. 1(A)

FIGS. 1(A) and 1(B) show a main portion of a film wiring board according to an embodiment of this invention.

In the film wiring board 21, wiring patterns 23 formed of metal, for example copper, are formed on an upper surface of a film base 22 of resin, as explained below. Predetermined portions of the wiring patterns 23 are shaped as almost circular connection pads 23a and lead wires 23b extended from the connection pads 23a. A protection film 25 formed of a synthetic resin such as an epoxy a resin is provided on the upper surface of the film base 22 so as to hold the wiring patterns 23 therebetween, except for the connection pads 23a. Thus, almost square opening 26 which allows the connection pads 23a to be exposed is formed in the protection film 25. As will be explained in detail below, electrodes of an IC chip is connected via soldering bumps to the connection pads 23a exposed through the opening 26, the IC chip is mounted on the film wiring board 21.

Figure 2A:
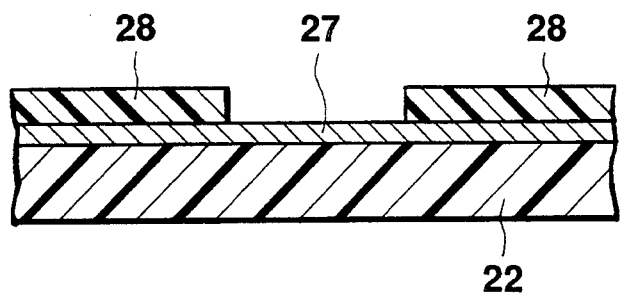
FIGS. 2(A) and 2(B) are cross-sectional views showing production steps of the film wiring board, respectively.
Figure 2B:
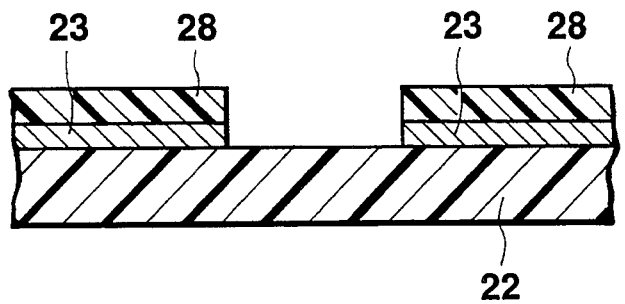

Then, the manufacture of the film wiring board 21 will be explained with reference to FIGS. 2(A) and 2(B). As shown in FIG. 2(A), a film base 22 on which a metal foil 27 for forming the wiring patterns 23 (see FIG. 1(A)) is coated is first prepared. As this preparing method, there are a casting method in which varnish of synthetic resin such as polyimide is coated on a surface of the copper metal foil 27 and then the varnish is solidified to form the film base 22, a spattering method in which a metal material for the metal foil 27 is spattered on the film base 22 and an electroless plating in which the metal material is plated on the film base 22, etc. Then, a photoresist 28 having determined patterns corresponding to the wiring patterns 23 are coated on the metal foil 27 by a well-known method of photolithography. The metal foil 27 is etched by the wet etching of a solution of copper chloride or ferric chloride with the photoresist 28 being used as an etching mask, so that the wiring patterns 23 having the connection pads 23a and the lead wires 23b are formed as shown in FIG. 2(B) and FIG. 1(A). In this case, since an adhesive agent is not interposed between the metal foil 27 and the film base 22, it is possible to determine the diameter of each of the connection pads 23a at 100 μm–140 μm which is the same as that of the conventional one and the width of each of the lead wires 23b at 10 μm–30 μm which is slender than that of the conventional one. Thereafter, the photoresist 28 is stripped. Then, a synthetic resin of epoxy is painted by a screen printing with use of a screen mask having predetermined patterns and the painted resin is dried, so that the protection film 25 having the square opening 26 at a position corresponding to the connection pads 23a is formed as shown in FIGS. 1(A) and 1(B). The square opening 26 is slightly larger than an outer shape of the IC chip. Thus, the film wiring board 21 is produced.

Figure 3A:
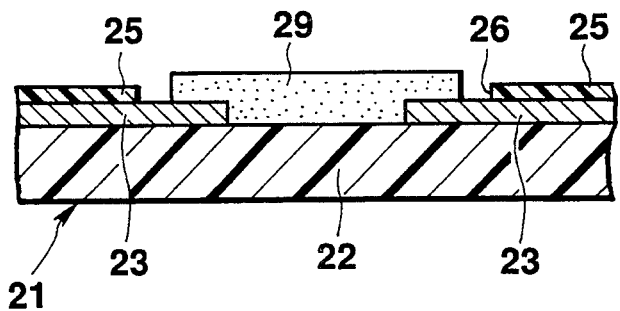
FIGS. 3(A)–3(C) are cross-sectional views showing steps of mounting an IC chip on the film wiring board.
Figure 3B:
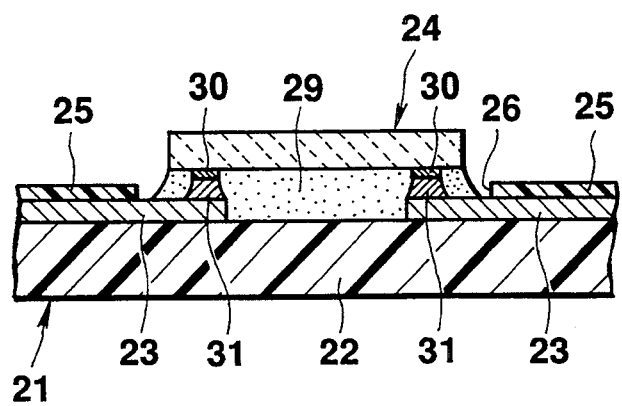
Figure 3C:
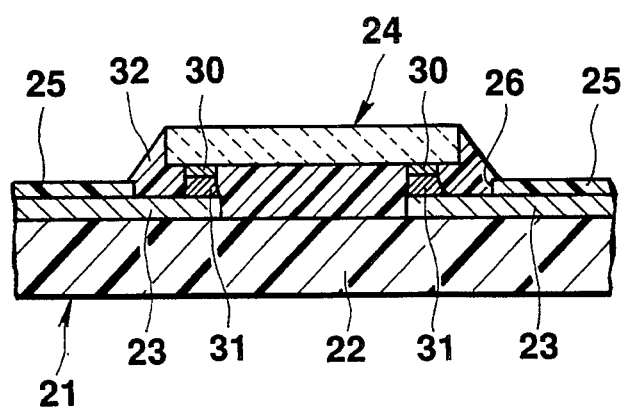

Then, steps of mounting the IC chip on the film wiring board 21 in a flip-chip method will be explained with reference to FIGS. 3(A)–3(C). First, as shown in FIG. 3(A), a flax 29 is painted by a letterpress printing at a portion of the film wiring board 21 where the IC chip is to be mounted. Then, as shown in FIG. 3(B), soldering bumps 31 provided in advance at connection electrodes 30 of the IC chip 24 are positioned at the exposed connection pads 23a (see FIG. 1(A)), and temporarily fixed thereto by the flax 29. By a thermal press using a thermal press head (not shown), the soldering bumps 31 are once melted, connected to the corresponding connection pads 23a, and solidified, so that the connection electrodes 30 of the IC chip 24 are connected through the soldering bumps 31 to the corresponding connection pads 23a. In this case, since the width of each of the lead wires 23b is comparatively small at almost 10 μm–30 μm, the once molten solder is stayed on the corresponding connection pad 23a by the surface tension, so that the flow of the molten solder from the connection pad 23a to the corresponding lead wire 23b is prevented. After this, the flax 29 is removed, and then the connecting portions are sealed by a sealing compound 32 as shown in FIG. 3(C). In this case, the opening 26 being slightly larger than the outer shape of the IC chip is covered by the sealing compound 32. Thus, the IC chip 24 is mounted on the film wiring board 21.

As explained above, since the width of each of the lead wires 23b is comparatively small at 10 μm–30 μm in this film wiring board 21, it is possible to stay the once molten solder on the corresponding connection pad 23a by the surface tension, and therefore prevent the molten solder from flowing from the corresponding connection pad 23a to the corresponding lead wire 23b and a short-circuit from occurring between the adjacent lead wires 23b. As a result, there is no need to make the openings 26 of the protective film 25 have a function to hold the molten solder, and no problem may happen if the dimension of the opening 26 is slightly larger than the outer shape of the IC chip 24. Further, the protection film 25 having the openings 26 can be formed in one step by the screen printing, and thus, productivity of the film wiring board may be increased and its manufacturing cost may be reduced.

If the distance between an end of the mounted IC chip 24 and an end of the sealing agent 32 is almost 500 μm, the dimensions of the opening 26 can be set in a range from those equal to the outer dimensions of the IC chip 24 to those obtained by adding about 200 μm to the dimensions of the IC chip 24 in its each edge because the positional accuracy by the screen printing is almost ±300 μm.

Figure 4A:
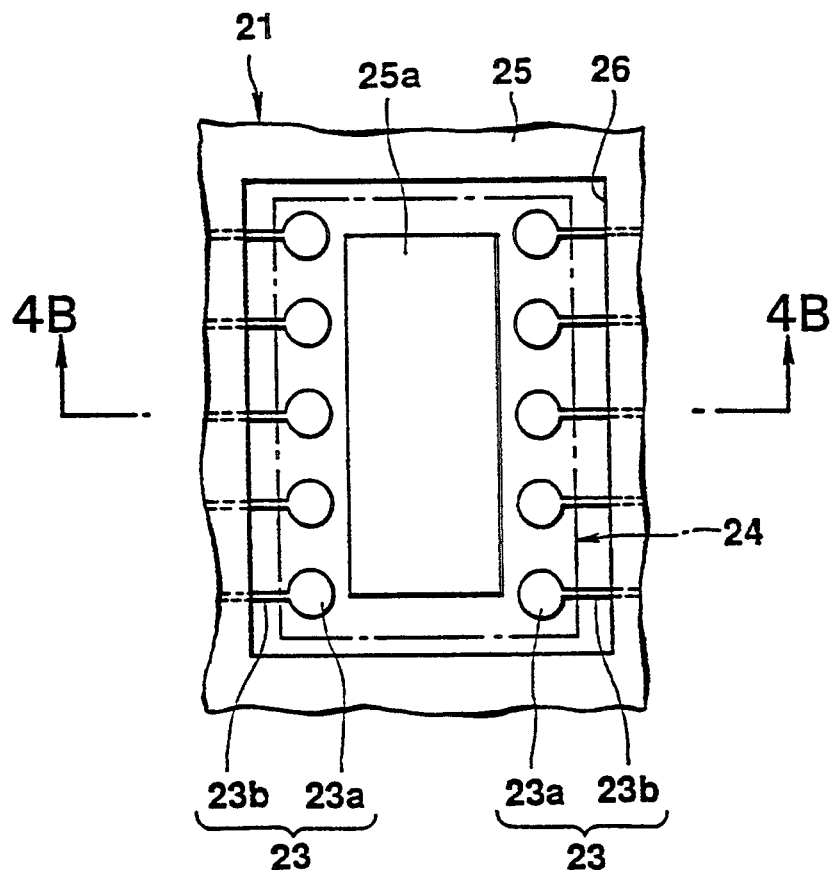
FIG. 4(A) is a plan view showing a main portion of a film wiring board according to another embodiment of this invention.
Figure 4B:
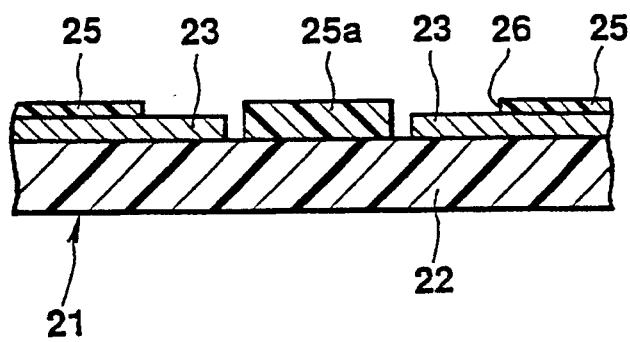
FIG. 4(B) is a cross-sectional view taken along line 4B—4B in FIG. 4(A)
Figure 5A:
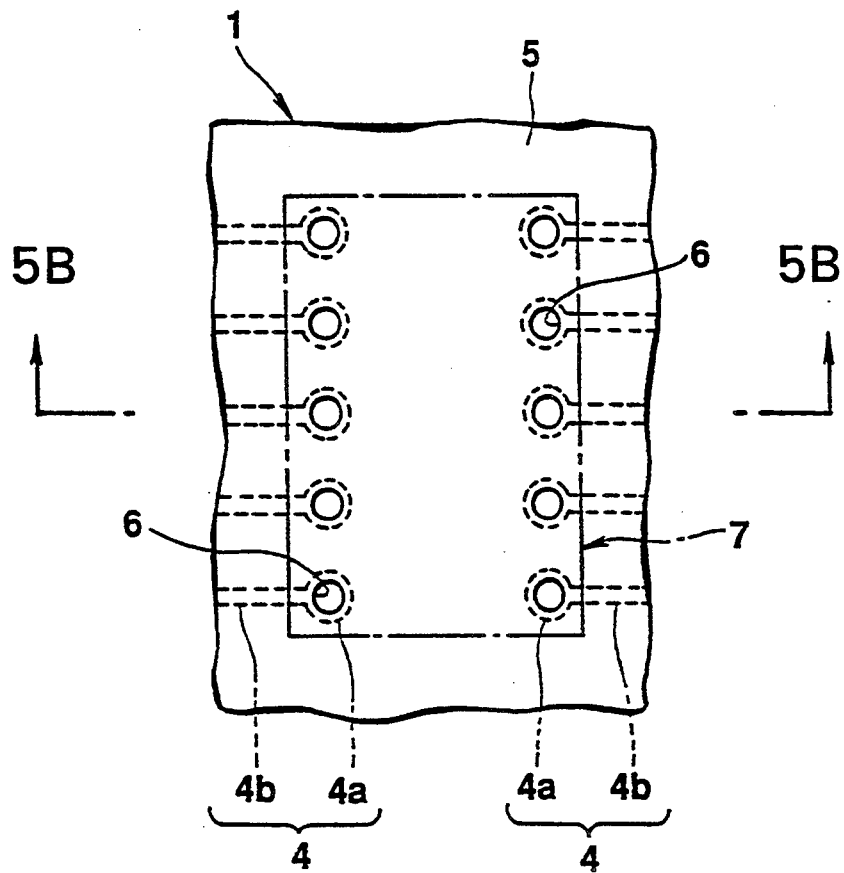
FIG. 5(A) is a plan view showing a part of a conventional film wiring board.
Figure 5B:
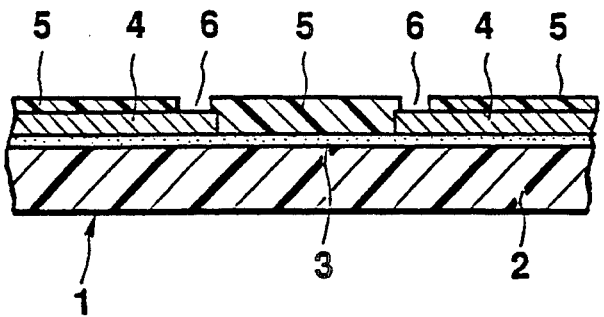
FIG. 5(B) is a cross-sectional view taken along line 5B—5B in FIG. 5(A)
Figure 6A:
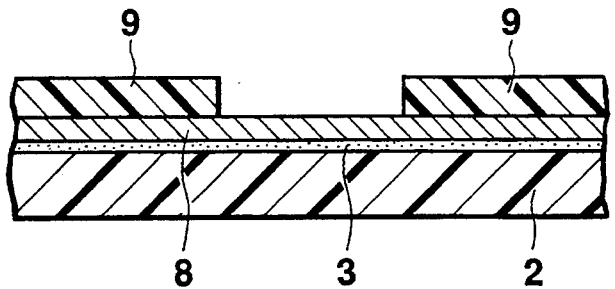
FIGS. 6(A)–6(C) are cross-sectional views showing production steps of the conventional film wiring board.
Figure 6B:
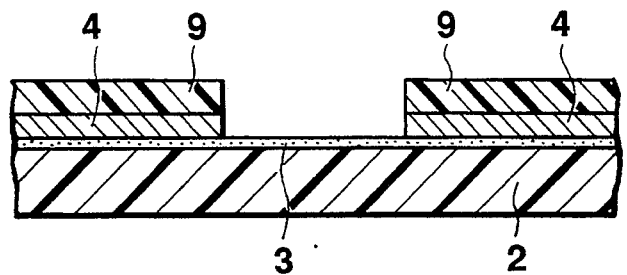
Figure 6C:
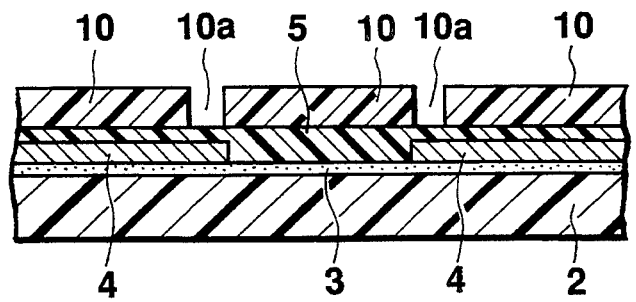
Figure 7A:
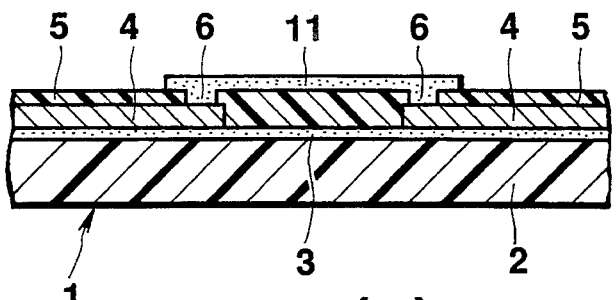
FIGS. 7(A)–7(C) are cross-sectional views showing steps of mounting the IC chip on the conventional film wiring board.
Figure 7B:
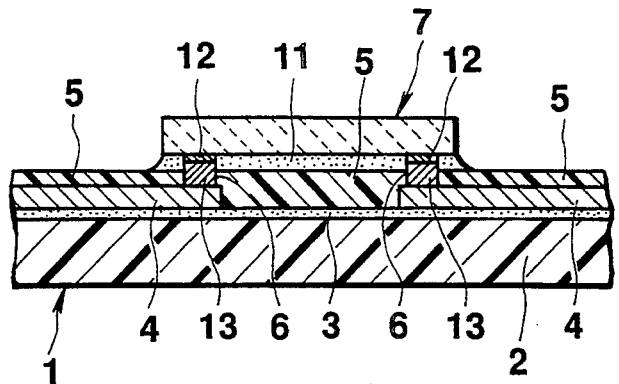
Figure 7C:
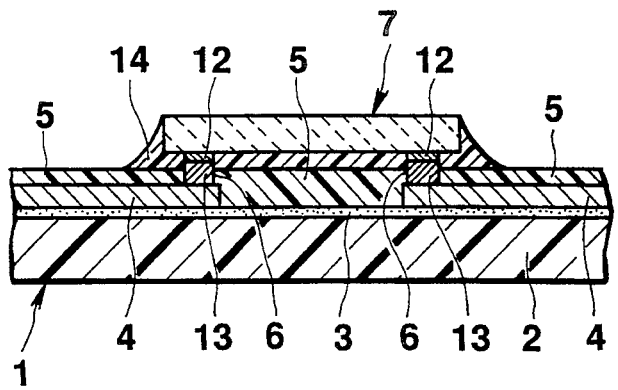

In the above embodiment, the opening 26 of the protective film 25 has a square shape to correspond to the outer shape of the IC chip 24. However, a protective film 25a of an island shape may be formed at a central portion of the opening 26, as shown in FIGS. 4(A) and 4(B). Further, in the embodiment, the IC chip 24 is mounted on the film wiring board 21 after the flax 29 is provided on the film wiring board 21. However, the IC chip 24 can be mounted on the film wiring board 21 after the flax 29 is provided at a bottom of the IC chip 24.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A film wiring board on which an electronic component is to be mounted via solder, comprising:
   a film base having an upper surface;
   a plurality of wiring patterns on said upper surface of said film base, each of said wiring patterns including a connection pad and a lead wire which is extended from the connection pad, the lead wire having a width of 10 μm–30 μm; and
   a protective film formed on said upper surface of said film base to hold said wiring patterns between said film base and said protective film, and said protective film having a single opening for a plurality of said connection pads, for exposing at least said plurality of said connection pads and the surroundings of said respective connection pads, the surroundings of said respective connection pads including portions of said lead wires which extend from said respective connection pads in the vicinity of each of the corresponding respective connection pads.

2. The film wiring board according to claim 1, wherein said opening has a shape which corresponds to an outer shape of an electronic component to be connected to said connection pads.

3. The film wiring board according to claim 2, wherein said film base is made of polyimide resin.

4. The film wiring board according to claim 3, wherein said wiring patterns are made of copper.

5. The film wiring board according to claim 4, wherein said wiring patterns are deposited members on said film base.

6. The film wiring board according to claim 5, wherein said protective film is made of epoxy resin.

7. The film wiring board according to claim 6, further comprising an island shaped protective film formed at a central portion of said opening on said upper surface of said film base.

8. The film wiring board according to claim 1, wherein said film base is made of polyimide resin.

9. The film wiring board according to claim 8, wherein said wiring patterns are made of copper.

10. The film wiring board according to claim 9, wherein said wiring patterns are deposited members on said film base.

11. The film wiring board according to claim 10, wherein said protective film is made of epoxy resin.

12. The film wiring board according to claim 11, further comprising an island shaped protective film formed at a central portion of said opening on said upper surface of said film base.

13. The film wiring board according to claim 2, wherein each of said lead wires has a length of at least 200 μm.

14. The film wiring board according to claim 13, wherein said film base is made of polyimide resin.

15. The film wiring board according to claim 1, wherein each of said lead wires has a length of at least 200 μm.

16. The film wiring board according to claim 15, wherein said film base is made of polyimide resin.

17. An electronic device comprising:
   (a) a film wiring board including:
      a film base having an upper surface;
      a plurality of wiring patterns on said upper surface of said film base, each of said wiring patterns including a connection pad and a lead wire which is extended from the connection pad, the lead wire having a width of 10–30 μm, and
      a protective film formed on said upper surface of said film base to hold said wiring patterns between said film base and said protective film, and said protective film having single opening for a plurality of said connecting pads, for exposing at least said plurality of connection pads and the surroundings of said respective connection pads, the surroundings of said plurality of connection pads including portions of said lead wires which extend from said respective connection pads in the vicinity of each of the corresponding respective connection pads; and (b) an electronic component having respective connection electrodes coupled to the respective connection pads of the wiring board by respective solder connections.

18. A junction structure of an electronic component comprising:

(a) a film wiring board including:
   a film base having an upper surface;
   a plurality of wiring patterns on said upper surface of said film base, each of said wiring patterns including a connection pad and a lead wire which is extended from the connection pad, the lead wire having a width of 10-30 μm, and
   a protective film formed on said upper surface of said film base to hold said wiring patterns between said film base and said protective film, and said protective film having a single opening for a plurality of said connecting pads, for exposing at least said plurality connection pads and the surroundings of said respective connection pads, the surroundings of said respective connection pads including portions of said lead wires which extend from said respective connection pads in the vicinity of each of the corresponding respective connection pads; and (b) an electronic component having respective connection electrodes coupled to said respective connection pads of said wiring board by respective solder connections.

* * * * *